(12) United States Patent
Tröger et al.

(10) Patent No.: US 10,530,300 B2
(45) Date of Patent: Jan. 7, 2020

(54) METHOD FOR THE FREQUENCY CORRECTION OF AN OSCILLATOR OF A SENSOR NODE OF A WIRELESS SENSOR NETWORK

(71) Applicants: Fraunhofer-Gesellschaft zur Förderung der angewandten Forschung e.V., München (DE); Friedrich-Alexander-Universität Erlangen-Nürnberg, Erlangen (DE)

(72) Inventors: Hans-Martin Tröger, Erlangen (DE); Norbert Franke, Erlangen (DE); Albert Heuberger, Erlangen (DE); Jörg Robert, Uttenreuth (DE)

(73) Assignees: Fraunhofer-Gesellschaft zur Förderung der angewandten Forschung e.V., München (DE); Friedrich-Alexander-Universität Erlangen-Nürnberg, Erlangen (DE)

( * ) Notice: Subject to any disclaimer, the term of this patent is extended or adjusted under 35 U.S.C. 154(b) by 0 days.

(21) Appl. No.: 16/076,539

(22) PCT Filed: Feb. 15, 2017

(86) PCT No.: PCT/EP2017/053433
§ 371 (c)(1),
(2) Date: Aug. 8, 2018

(87) PCT Pub. No.: WO2017/148705
PCT Pub. Date: Sep. 8, 2017

(65) Prior Publication Data
US 2019/0052227 A1 Feb. 14, 2019

(30) Foreign Application Priority Data
Feb. 29, 2016 (DE) .......................... 10 2016 203 249
Jul. 6, 2016 (EP) ...................................... 16178244

(51) Int. Cl.
*H04W 72/04* (2009.01)
*H04L 27/26* (2006.01)
(Continued)

(52) U.S. Cl.
CPC ............. *H03D 3/004* (2013.01); *H03L 7/189* (2013.01); *H04L 27/2657* (2013.01); *H04L 27/2675* (2013.01); *H04L 27/2695* (2013.01)

(58) Field of Classification Search
CPC ........... H04L 5/00; H04L 27/26; H04L 27/22; H04W 72/04; H04W 72/0453
See application file for complete search history.

(56) References Cited

U.S. PATENT DOCUMENTS 8,649,755 B2* 2/2014 Moeglein .......... H04W 52/0229
455/343.2
9,048,979 B2* 6/2015 Park ...................... H04L 7/0016
(Continued)

OTHER PUBLICATIONS

Time and Frequency Synchronization of a Wireless Sensor Network with Signals of Opportunity, Troger, Hans-Martin et al., Proceedings of the 2014 Precise Time and Time Interval Meeting, Boston, Massachusetts, 1-4, Dec. 2014. (Year: 2014).*
(Continued)

*Primary Examiner* — Blane J Jackson
(74) *Attorney, Agent, or Firm* — Schwegman Lundberg & Woessner, P.A.

(57) ABSTRACT

The invention relates to a method for the frequency error correction of an oscillator of a sensor node in a sensor network, comprising the following steps: receiving a transmission signal of a transmitter, the signal being modulated by orthogonal frequency division multiplexing (OFDM); determining the frequency deviation of the oscillator using the received transmission signal; determining a correction signal for correcting the frequency deviation of the oscillator (Continued)

Figure 1:
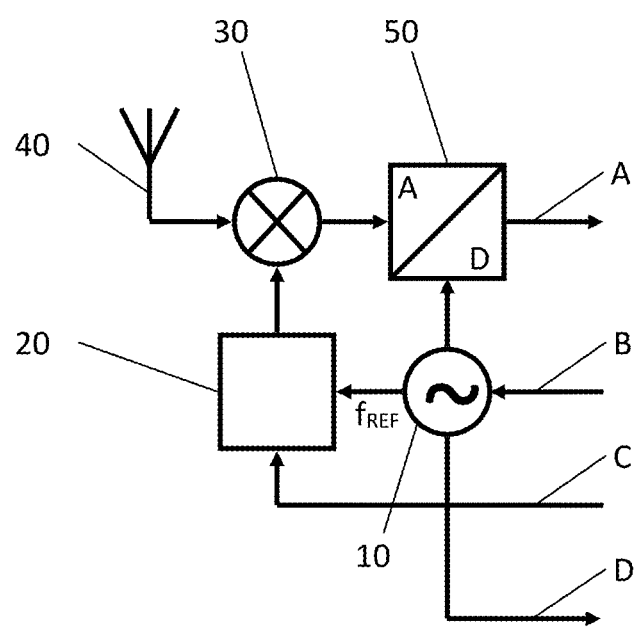

and correcting the frequency of the oscillator by means of the correction signal.

14 Claims, 6 Drawing Sheets

(51) Int. Cl.
    *H03D 3/00*     (2006.01)
    *H03L 7/189*     (2006.01)

(56) References Cited

U.S. PATENT DOCUMENTS

| | | | | |
|---|---|---|---|---|
| 9,538,537 | B1* | 1/2017 | Cui | H04L 5/0007 |
| 2009/0196163 | A1* | 8/2009 | Du | H04L 5/0046 |
| | | | | 370/204 |
| 2012/0127977 | A1* | 5/2012 | Copeland | H04L 1/0015 |
| | | | | 370/338 |
| 2015/0312078 | A1* | 10/2015 | Bogdan | H04L 7/0087 |
| | | | | 375/226 |

OTHER PUBLICATIONS

"International Application Serial No. PCT/EP2017/053433, International Search Report dated Jul. 27, 2017", w/ English Translation, (dated Jul. 27, 2017), 5 pgs.

"International Application Serial No. PCT/EP2017/053433, Written Opinion dated Jul. 27, 2017", (dated Jul. 27, 2017), 9 pgs.

Elson, Jeremy, et al., "Fine-grained network time synchronization using reference broadcasts", ACM SIGOPS Operating Systems Review 36.SI, (2002), 147-163.

Troeger, Hans-Martin, et al., "Frequency and Time Synchronization of a Wireless Sensor Network with Signals of Opportunity", PTTI 2014—Proceedings of the 46th Annual Precise Time and Time Interval Systems and Applications Meeting, The Institute of Navigation, (Dec. 4, 2014), 117-123.

\* cited by examiner

METHOD FOR THE FREQUENCY CORRECTION OF AN OSCILLATOR OF A SENSOR NODE OF A WIRELESS SENSOR NETWORK

PRIORITY APPLICATIONS

This application is a U.S. National Stage Filing under 35 U.S.C. 371 from International Application No. PCT/EP2017/053433, filed on Feb. 15, 2017, and published as WO2017/148705 on Sep. 8, 2017, which claims the benefit of priority to European Application No. 16178244.6, filed on Jul. 6, 2016 and German Application No. 10 2016 203 249.6, filed on Feb. 29, 2016; the benefit of priority of each of which is hereby claimed herein, and which applications and publication are hereby incorporated herein by reference in their entirety.

The invention relates to a method for frequency correction (syntonisation) of the local reference oscillators of sensor nodes of a sensor node network.

Wireless sensor networks are becoming more important in daily life. Meter readings of gas and water meters are nowadays often retrieved by the mains operator in a wireless manner. Likewise, facilities in the field of production or logistics are often provided with wireless sensors. A sensor with a communication unit for transmitting the sensor data and possibly further data is referred to as a sensor node. A plurality of sensor nodes within a certain region can form a sensor network.

The knowledge of the precise position of the sensor nodes is of particular significance for many applications. The positions of the sensor nodes are often determined by means of a network of stationary receivers, wherein such a receiver can also be a component of a sensor node of a sensor network. The exact position of the sensor node to the localised can be determined by different locating methods such as a direct time-of-flight measurement of signals between several receivers or a differential time-of-flight measurement of signals between several receivers.

Concerning such methods, the provision of highly accurate time information in each sensor node of the sensor network is of particular significance. Usually, each sensor node comprises a local reference oscillator as a clock generator, from whose frequency the time information which is required for the operation of the sensor node is derived.

One aspect of the provision of highly accurate time information in each sensor node of the sensor network is the syntonisation of the local clock generators of the sensor nodes. The syntonisation ensures that the local clock generators run at the same clock rate in each sensor node. The syntonisation is also called frequency synchronisation.

A phase-locked relation of the reference oscillators of the sensor nodes is already sufficient for many of the exemplarily cited localisation methods.

A further aspect of the provision of highly accurate time information in each sensor node of the sensor network is the time synchronisation of the local clock generators of the sensor nodes. The time synchronisation ensures that the local clock generators output the same time value at a given point in time in each sensor node.

What is known is the provision of highly accurate time information by way of the GPS system. However, the achievable precision is often not sufficient and the application indoors is not possible. Concerning indoor regions, at present there is only the possibility of falling back on cable-connected clock distributions, which however rules out many applications, in particular wireless sensor nodes.

It is the object of the present invention to specify a method for the frequency correction of the local reference oscillators of a sensor node.

This object is achieved by the method according to patent claim 1. The further patent claims specify advantageous embodiments of the method according to the invention.

The method according to the invention is based on the use of so-called signals of opportunity as a frequency reference. Radio signals which are originally emitted for another defined purpose and that are suitable for a frequency synchronisation of a local reference oscillator with its transmission frequency are referred to as signals of opportunity.

For example, television or broadcast radio signals (DVB-T, DAB) or also signals of communication networks (GSM, UMTS, LTE) are suitable as signals of opportunity. These signals are usually emitted within a geographic region from several different locations with a high transmitting power and bandwidth and can also be received with a favourable signal-to-noise ratio in buildings without a line-of-sight connection to the transmitter. Furthermore, these signals have advantageous features, such as the coupling onto a highly accurate reference frequency, a high frequency stability and characteristic signal sequences, from which information for the adjustment of frequency and phase of the local reference oscillators of the sensor nodes can be obtained.

The method according to the invention for the frequency correction of an oscillator of a sensor node of a sensor network comprises the method steps:

receiving a transmission signal of a transmitter with a modulation according to orthogonal frequency-division multiplexing (OFDM);

determining the frequency deviation of the oscillator based on the received transmission signal;

determining a correction signal for the correction of the frequency deviation of the oscillator;

correcting the frequency of the oscillator with the correction signal.

In a further development of the method, a carrier frequency deviation of the received transmission signal is determined for determining the frequency deviation of the oscillator.

In a further development of the method, a sampling clock offset of the received transmission signal is determined for determining the frequency deviation of the oscillator.

In a further development of the method, the sampling clock offset is corrected independently of the correction of the frequency deviation of the oscillator.

In a further development of the method, the determining of the frequency deviation is based on the phase relations of received individual carriers of the transmission signal.

In a further development of the method, the determining of the sampling clock offset is based on the phase relations of received individual carriers of the transmission signal.

In a further development of the method, the determining of the frequency deviation is carried out for the time period of the transmission of a transmission symbol.

In a further development of the method, the determining of the frequency deviation is carried out for the time period of the transmission of two consecutive transmission symbols.

In a further development of the invention after receiving the transmission signal, the channel impulse response of the transmission channel is determined from the received transmission signal;

the signals of different transmission paths of the received transmission signal are determined from the channel impulse response; and the frequency deviation of the oscillator is determined based on a signal of a transmission path.

In a further development of the method, the frequency deviation of the oscillator is determined based on the signal of a plurality of transmission paths.

In a further development of the method, a signal is selected for determining the frequency deviation of the oscillator based on its signal energy, its signal quality or its temporal relation to other signals of the channel impulse response.

In a further development of the method, the transmission signals of a plurality of transmitters are received.

In a further development of the method, the sensor node is communicatively connected to further sensor nodes and transfers information on the receiving transmitter to further sensor nodes.

In a further development of the method, the receiving transmitter is selected based on information which is received from another sensor node.

In a further development of the method, the received transmission signal comprises time information and the oscillator is time-synchronised based on the time information.

Figure 2:
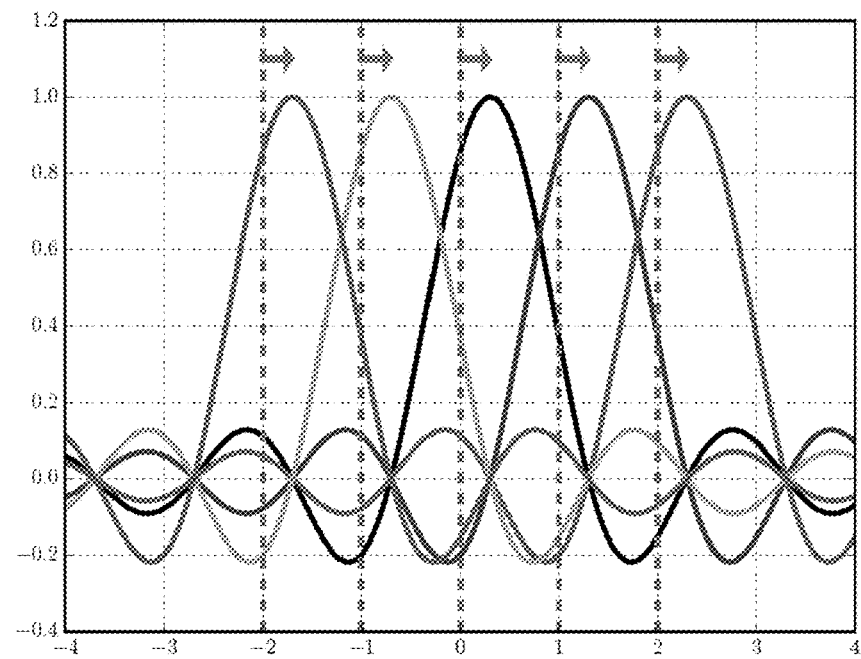
Figure 3:
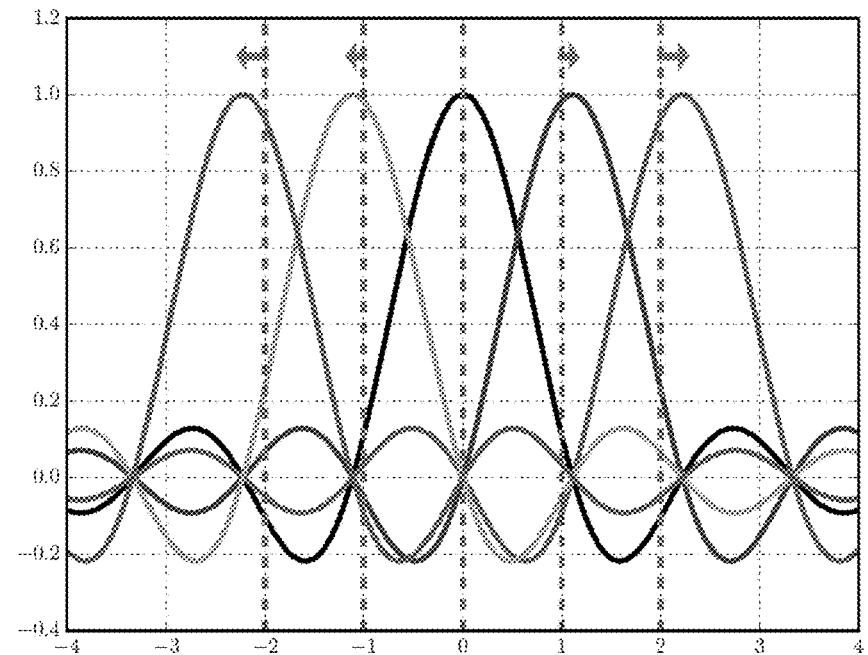
Figure 4:
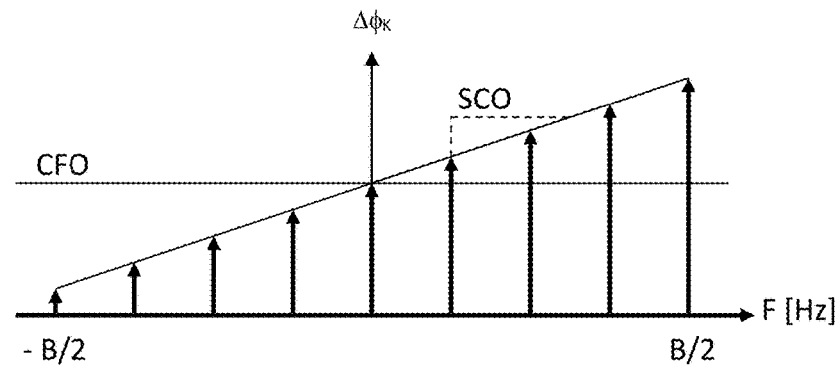
Figure 5:
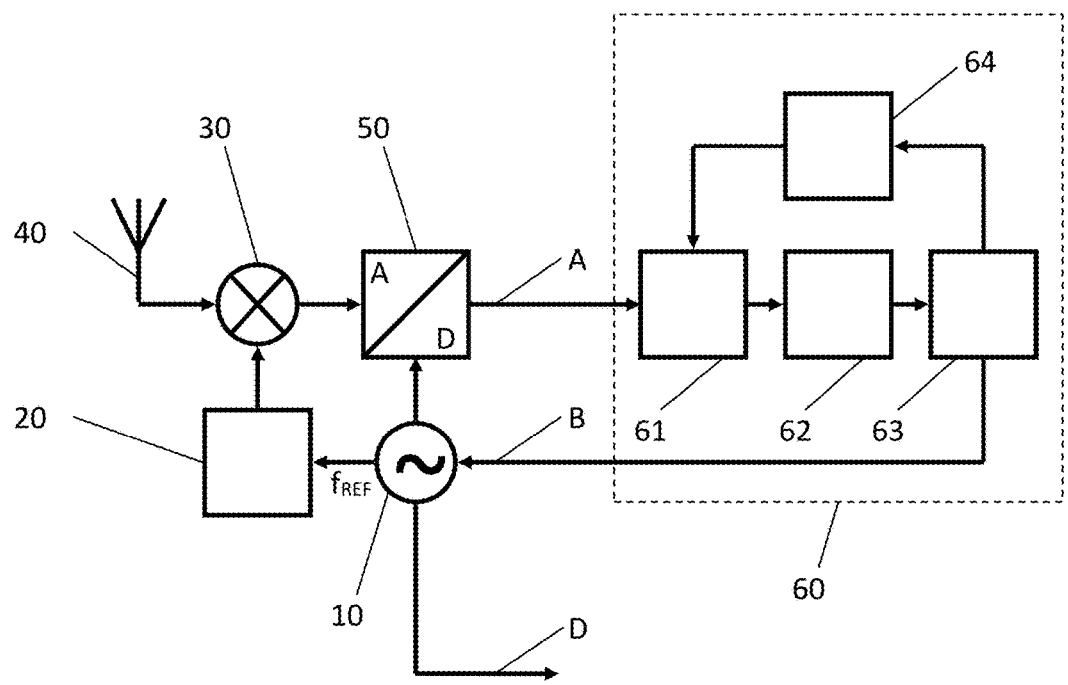
Figure 6A:
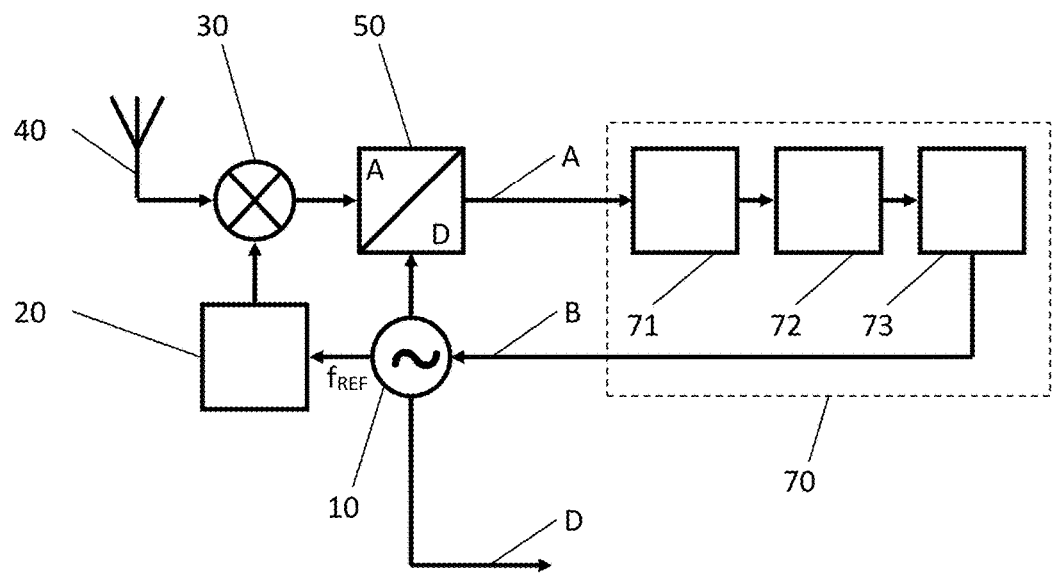
Figure 6B:
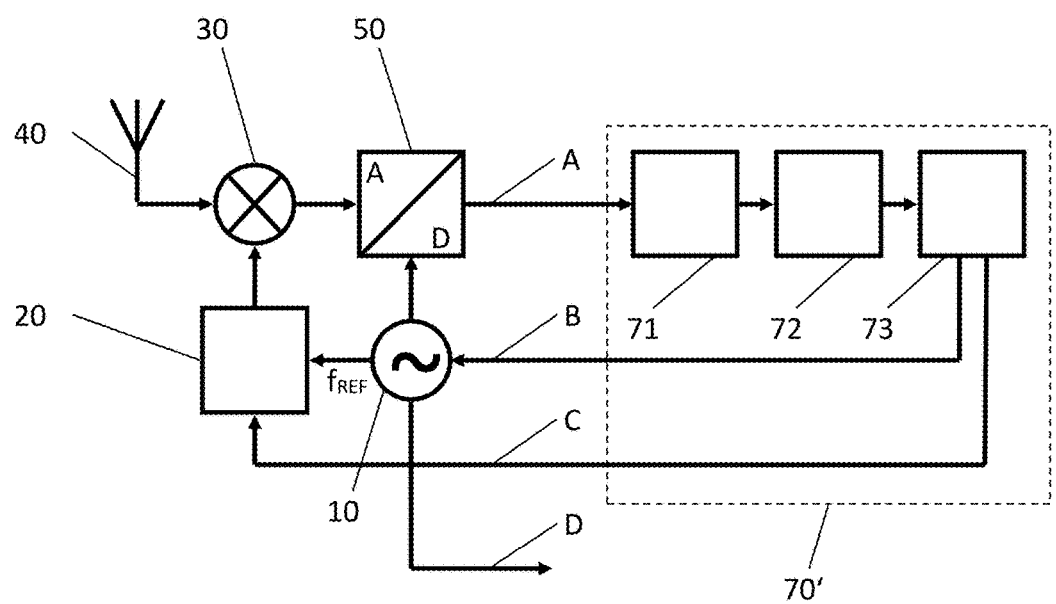
Figure 7:
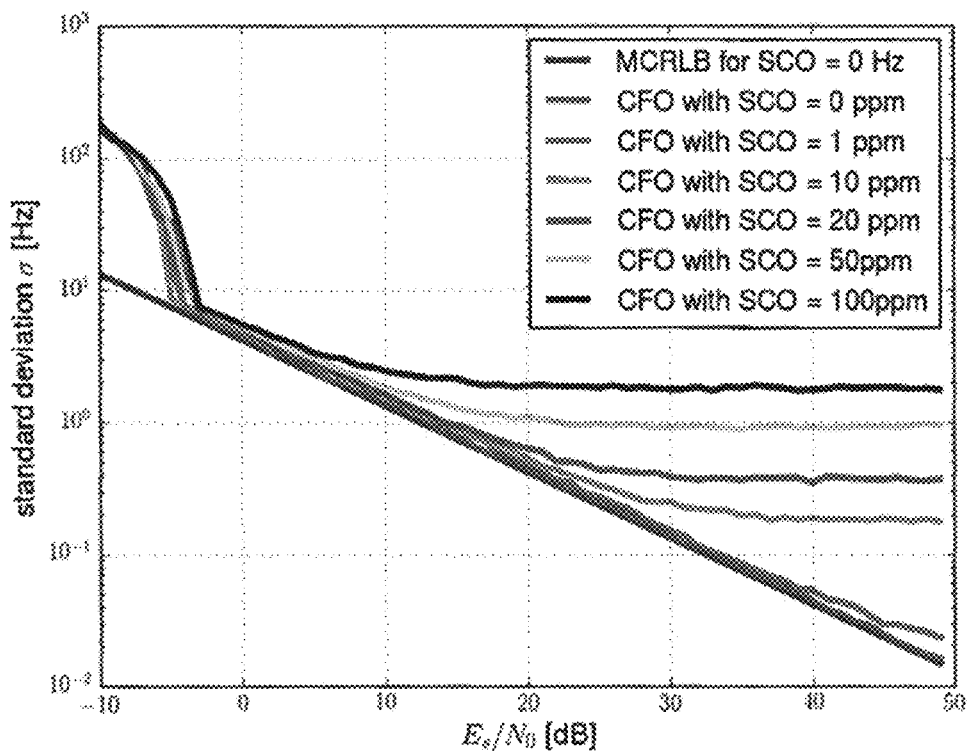
Figure 8:
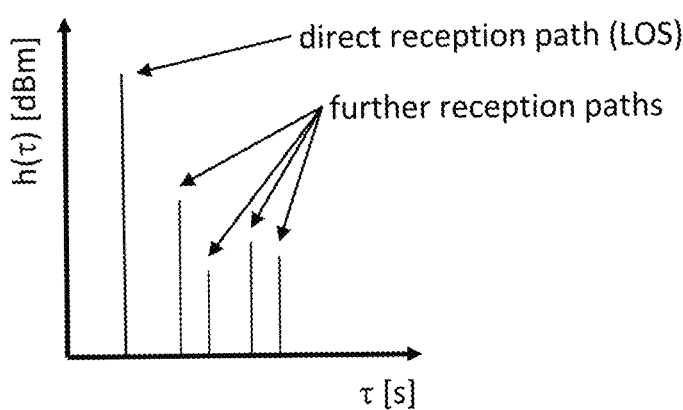
Figure 9:
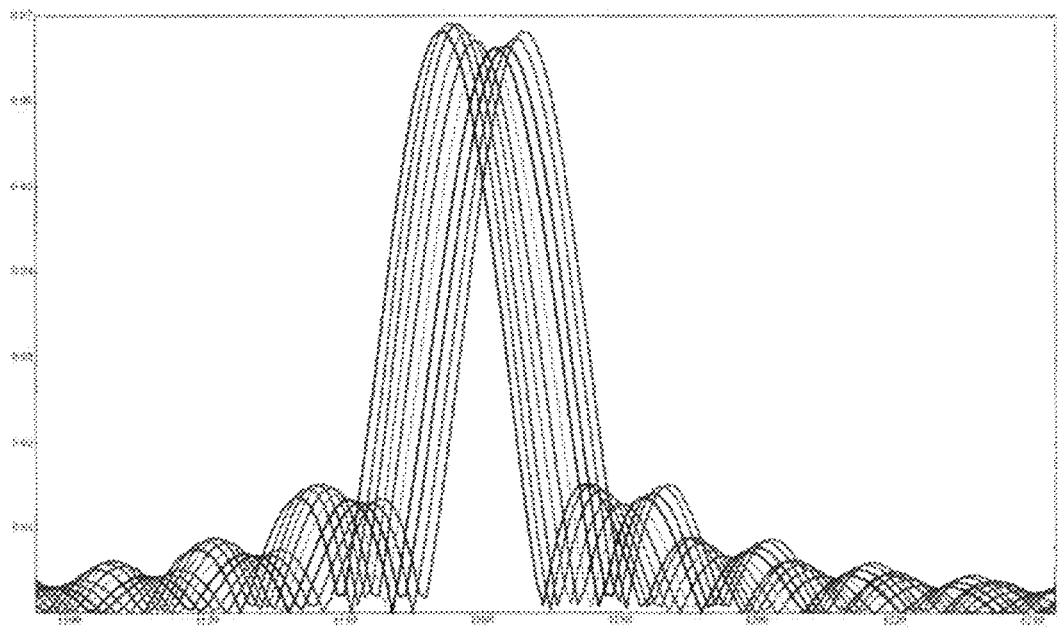
Figure 10:
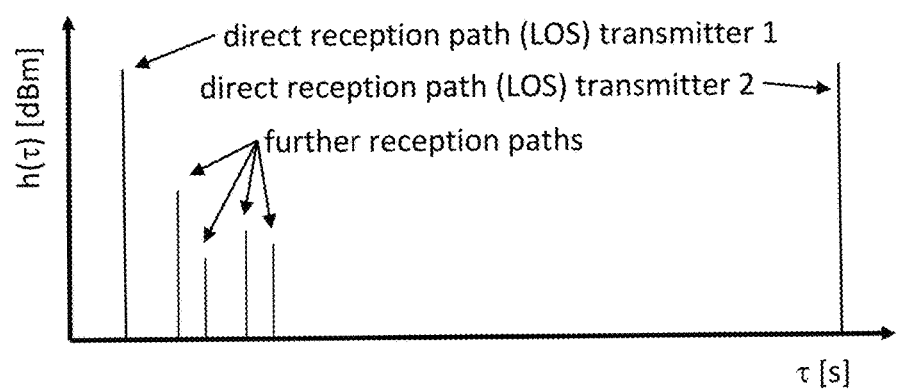

The invention is hereinafter explained in more detail by way of embodiment examples. The attached drawings represent in:

FIG. 1 a block diagram of the input block of a receiver for receiving OFDM modulated signals for a sensor node;

FIG. 2 the sampling error of the individual carriers of an OFDM signal, said sampling error resulting from a carrier frequency offset;

FIG. 3 the sampling error of the individual carriers of an OFDM signal, said sampling error resulting from a sampling clock offset;

FIG. 4 the influence of the carrier frequency offset and sampling clock offset on the phases of the individual carriers of an OFDM signal;

FIG. 5 an OFDM receiver;

FIG. 6A an embodiment example of an OFDM receiver with a control device for the correction of the oscillator frequency;

FIG. 6B a further embodiment example of an OFDM receiver with a control device for the correction of the oscillator frequency;

FIG. 7 the influence of the deviation of the sampling clock offset (SCO) on the estimation of the sampling frequency offset (CFO);

FIG. 8 the representation of a channel impulse response given a multi-path reception;

FIG. 9 the temporal dependency of a peak in the channel impulse response in dependence on the sampling clock offset (SCO);

FIG. 10 the representation of a channel impulse response given a multi-path reception, for two transmitters in a single frequency network (SFN).

A synchronisation of the local reference oscillators of the individual sensor nodes is necessary for many methods of the localisation of sensor nodes. Concerning the synchronisation, one must differentiate between frequency synchronisation and time synchronisation. Frequency synchronisation has the aim of bringing the frequency of the local reference oscillators of the individual sensor nodes into synchronous operation or to determine the deviation from an external reference frequency. A time synchronisation is to be understood as the alignment of different local clock times of the individual sensor nodes to an external reference time.

The frequency synchronisation of the local reference oscillators of several sensor nodes by way of signals of opportunity is based on the recognition that radio broadcasting signals and mobile radio signals which are used as a signal of opportunity are usually generated with respect to a very exact reference frequency (OCXO, rubidium—frequency standard or the like) and therefore form a highly accurate reference frequency. The aim of the frequency synchronisation is then to determine the deviation between the local imprecise reference frequency of the sensor nodes and the very exact reference frequency of the selected SoO and to correct this, by way of correction signals being determined from the SoO, said correction signals correcting the frequency of the local reference oscillator of the sensor node by way of analogue or digital control or also mixed forms of these.

For the frequency synchronisation of their local reference oscillators, the sensor nodes comprise a reception channel which can completely or partly receive the selected signal of opportunity. The oscillator of this reception channel simultaneously forms the local reference oscillator of the sensor node. Furthermore, a further, wireless data connection (e.g. W-LAN) between the individual sensor nodes is advantageous, in order to be able to exchange data between the sensor nodes.

For this, the sensor node can comprise a transmitting unit and a receiving unit for the data connection as well as further receiving units for the signal of opportunity to be received, which use a common local reference oscillator.

Alternatively, the sensor node can also comprise only one receiving unit, which is alternately switched between the data reception and the reception of the signal of opportunity.

Alternatively, the sensor node can also comprise only one receiving unit which is designed for the simultaneous data reception and the reception of the signal of opportunity.

The frequency synchronisation by way of signals of opportunity which are modulated according to orthogonal frequency-division multiplexing (OFDM) is described hereinafter.

An OFDM modulated signal consists of a plurality of narrow-band individual carriers with a constant frequency spacing. The digital data which are to be transmitted are modulated onto the individual carriers with a modulation method such as quadrature phase-shift keying (QPSK) or quadrature amplitude modulation with 16 or 64 symbols (16-QAM or 64-QAM).

Certain individual carriers are herein modulated with a known predefined symbol sequence. The respective symbol sequence is also called a pilot signal. The pilot signal is continuously transmitted on a part of the individual carriers in the temporal sequence of the transmission signal. These individual carriers are also called pilot carriers. Additionally, further individual carriers can likewise transmit the pilot signal at certain times, instead of the payload data. The phase position and frequency position of the individual carriers which transmit the pilot signal can be determined by way of a correlation of the received signal with known symbol sequences of the pilot signals.

Receivers for OFDM modulated signals determine the carrier frequency of the OFDM signal or the carrier frequencies of the individual carriers as well as the sampling clock for sampling the signal with respect to a local reference frequency which is generated by an oscillator.

FIG. 1 shows a block diagram of the input block of a receiver for the reception of OFDM modulated signals for a sensor node.

The receiver which is shown by way of example is designed as a direct conversion receiver. An oscillator 10 generates the local reference frequency $f_{REF}$. The local reference frequency $f_{REF}$ is fed to a phase locked loop (PLL) 20. The PLL 20, with the local reference frequency $f_{REF}$ as a reference, generates a frequency which corresponds to the carrier frequency of the reception signal and which is fed to the mixer 30. The input signal which is received by an antenna 40 is likewise fed to the mixer 30. The output signal of the mixer corresponds to the transmission signal before conversion to the carrier frequency. The output signal of the mixer is subsequently fed to an analogue/digital converter 50. The sampling frequency of the analogue/digital converter is likewise obtained from the local reference frequency $f_{REF}$. The output signal of the analogue/digital converter 50 is present at the output A. A first correction signal for the correction of the local reference frequency $f_{REF}$ can be fed to the oscillator 10 via the input B. A second correction signal for the correction of the carrier frequency which is generated by the PLL 20 can be fed to the PLL 20 via the input C. The (possibly corrected) local reference frequency $f_{REF}$ for the use in further subassemblies of the sensor node is available at the output D.

Frequency deviations of the local reference frequency of the receiver in comparison to the reference frequency of the transmitter lead to a carrier frequency deviation, which is hereinafter referred to as carrier frequency offset, CFO and/or to sampling rate error, which is hereinafter referred to as sampling clock offset, SCO of the received signal.

A carrier frequency offset already manifests itself at the output of the mixer in the frequency domain in a constant frequency offset of all individual carriers in comparison to their respective nominal frequency. The carrier frequency offset, given a subsequent analogue/digital conversion, leads to all individual carriers being sampled to the same extent outside their maximum and the orthogonality of the individual carriers is therefore being lost. This is represented symbolically in FIG. 2. FIG. 2 by way of example shows five individual carriers of an OFDM signal. The x-axis of FIG. 2 shows the frequency of the OFDM signal normalised to the centre frequency of the OFDM signal with a scaling corresponding to the nominal spacing of the individual carriers. The y-axis of FIG. 2 represents a normalised amplitude of the individual carriers. The curves which are shown in FIG. 2 represent the individual carriers of the OFDM signal. The vertical dashed lines in FIG. 2 show the sampling outside the maximum of the individual carriers, said sampling resulting from the carrier frequency offset, whereas the horizontal arrows symbolise the shift of the sampling. The result is an undesirable inter-symbol interference between the symbols which are modulated onto different individual carriers.

With regard to two temporally consecutive symbols, a carrier frequency offset effects a constant shift of the phase of each individual carrier.

A sampling clock offset manifests itself in the frequency domain in an offset of the sampling point in time of the individual carriers, said offset increasing or decreasing with the frequency. This is represented symbolically in FIG. 3. FIG. 3 likewise by way of example shows five individual carriers of an OFDM signal. The x-axis of FIG. 3 shows the frequency of the OFDM signal normalised onto the centre frequency of the OFDM signal with a scaling corresponding to the nominal spacing of the individual carriers. The y-axis of FIG. 3 represents a normalised amplitude of the individual carriers. The curves which are represented in FIG. 3 represent the individual carriers of the OFDM signal. The vertically dashed lines in FIG. 3 show the sampling of the individual carriers which results from the sampling clock offset, whereas the horizontal arrows symbolise the shift of the sampling. A linearly increasing or decreasing phase of adjacent individual carriers results from this, as is represented in FIG. 4. The x-axis of FIG. 4 show the frequency of the OFDM signal normalised to the centre frequency of the OFDM signal, whereas the vertical arrows symbolise the individual carriers. The y-axis of FIG. 4 shows the phase position of the individual carriers. The individual carriers would have the same phase position without a sampling clock shift, as is represented by the horizontal line which is indicated at CFO. The carrier frequency offset effects a shifting of the phase positions of all individual carriers on the y-axis.

A correction signal can be derived from the previously described phase changes, caused by carrier frequency offset and/or the sampling clock offset, of the individual carriers to one another or of the individual carriers of two consecutive symbols, in order to correct the local reference frequency of the receiver.

This can be effected for example by way of a control device which is known from the state of the art, as is represented in FIG. 5. The control device 60 which is represented in FIG. 5 and which for the input block of a receiver which is represented in FIG. 1 and is for the reception of OFDM modulated signals realises an algorithm, in which the sampling clock offset is corrected by the control device 60 before determining a correction signal for the correction of the carrier frequency offset. For this, the control device 60 receives the output signal from the output A of the analogue/digital converter 50 of the input block of the receiver which was previously described with regard to FIG. 1, and leads this to a re-sampler 61 (sampling clock converter) which can carry out very small sampling clock adaptations, in order to correct the sampling clock offset. The signal of the re-sampler 61 is fed to an FFT 62 whose output signals are delivered to an estimator 63. The estimator 63 estimates and corrects the sampling clock offset by way of a correction signal for adapting the sampling clock adaptation being fed to the re-sampler 61 via a loop filter 64. After the correction of the sampling clock offset, the estimator 63 determines a correction signal which is fed to the oscillator via the input B, for the correction of the oscillator frequency.

Herein, the disadvantage is the high complexity of the control device, in particular of the re-sampler, which demands a high circuiting effort and a high computation power on processing and are not therefore suitable for application in sensor nodes with a limited computation power.

The basic circuits of control devices according to the invention are represented in FIG. 6A and FIG. 6B.

The control device 70 which is represented in FIG. 6A receives the output signal from the output A of the analogue/digital converter 50 of the previously described input block of the receiver and is designed to output a first correction signal to the input B of the input block of the receiver. The first correction signal influences the local reference frequency of the oscillator 10 of the receiver and therefore directly influences the carrier frequency offset and the sampling clock offset of the OFDM receiver. A frequency synchronisation of the oscillator 10 with the frequency of the received signal of opportunity is achieved when the carrier frequency offset and the sampling clock offset are compensated by the first correction signal.

This control device can advantageously be applied when, on generating an OFDM modulated signal of opportunity, the same reference signal was used for generating the sampling clock and for the generation of the carrier frequency.

The control device 70' which is represented in FIG. 6B receives the output signal from the output A of the analogue/digital converter 50 of the previously described input block of the receiver and is designed to output a first correction signal to the input B of the input block of the receiver and to output a second correction signal onto the input C of the input block of the receiver. As already described, the first correction signal influences the local reference frequency of the oscillator 10, whereas the second correction signal influences the carrier frequency which is generated by the PLL 20. The bringing of the local reference frequency of the oscillator of the receiver into synchronisation with the frequency of the signal of opportunity and simultaneously the separate influencing of the carrier frequency offset and the sampling clock offset of the receiver is rendered possible by way of a suitable selection of the first and the second correction signal.

A frequency synchronisation of the oscillator 10 with the frequency of the received signal of opportunity is achieved when the carrier frequency offset is compensated by the first and second correction signal.

This control device can be advantageously used if, on generating an OFDM modulated signal of opportunity, different reference frequencies have been used for generating the sampling clock and for generating the carrier frequency.

The control devices 70 and 70' preferably operate iteratively and process at least one or also several successive OFDM symbols. For this, the control devices comprise a suitably dimensioned buffer memory 71 for the intermediate storage of the digital data flow of the analogue/digital converter 50. The control devices further comprise units 72 for determining the phases and/or the phase ratios of the individual carriers of one or more consecutive symbols and units 73 for estimating the carrier frequency offset and/or the sampling clock offset which result from this. The first and possibly the second correction signal are determined from the carrier frequency offset and/or the sampling clock offset.

The phase shifts which are caused by the carrier frequency offset and the sampling clock offset can be determined for example for the continuously transmitted pilot carriers by way of a correlation of the received signal with the known symbol sequence of the pilot carriers. A further possibility is a correlation of currently received OFDM symbols with the OFDM symbols which are received in a previous symbol step. Herein, a phase difference can be determined for example as a difference of phases of two consecutive symbols.

This provides an increased accuracy, since herein, all individual carriers are co-taken into account. The determining of the carrier frequency offset and the sampling clock offset can be effected by way of known estimation methods in both cases.

A further improvement of the accuracy of the evaluation of the carrier frequency offset and the sampling clock offset can be achieved by way of the received signal being demodulated and being modulated again according to the same method as the transmission signal whilst using the local reference frequency. The thus obtained copy of the transmission signal is compared to the received signal, in order to determine deviations of the phase position of the individual carriers.

In an embodiment, the control device according to FIG. 6A is designed to determine the first correction signal from the estimated carrier frequency offset. In a further embodiment, the control device according to FIG. 6A is designed to determine the first correction signal from the estimated sampling clock offset. In a further embodiment, the control device according to FIG. 6A is designed to determine the first correction signal from the combination of the estimated carrier frequency offset and the estimated sampling clock offset.

In an analogous manner, the control device according to FIG. 6B is designed to determine estimation values for the carrier frequency offset and/or the sampling clock offset of the receiver and to determine the first correction signal and the second correction signal from these such that either the carrier frequency offset or the sampling clock offset of the receiver or both are influenced.

FIG. 7 shows simulation results for the influence of the deviation of the sampling clock offset upon the estimation of the carrier frequency offset. Represented on the X-axis is the symbol/noise ratio $E_S/N_O$ in dB and on the Y-axis the standard deviation of the estimation of the carrier frequency offset (CFO) in Hz for sampling clock offsets (SCO) of 0, 1, 10, 20, 50 and 100 ppm. It can be recognised that the standard deviation of the estimation of the carrier frequency offset (CFO) in Hz successively increases for the represented sampling clock offset (SCO) of 0, 1, 10, 20, 50 and 100 ppm.

For values smaller than 10 dB $E_S/N_O$, a reduction of the sampling clock offset (SCO) effects no significant improvement of the result of the estimation of the carrier frequency offset (CFO).

It can be recognised that sampling clock offsets (SCO) of less than 50 ppm hardly influence the results of the estimation of the carrier frequency offset (CFO), for a realistic reception ratio of 20 dB $E_S/N_O$ In an embodiment, the control device 70' according to FIG. 6B can therefore be designed to carry out the correction of the carrier frequency offset and of the sampling clock offset in dependence on the symbol/noise ratio $E_S/N_O$. Furthermore, the control device 70' can be designed to only correct the carrier frequency offset of the receiver for values of $E_S/N_O$ below a predefined threshold value.

The control device 70' according to FIG. 6B can further be designed to iteratively firstly only influence the sampling clock offset of the receiver until the sampling clock offset falls below a predefined threshold value and to subsequently minimise the carrier frequency offset.

On receiving the signal of opportunity, particularly in indoor areas, one should reckon with a very pronounced multi-path reception. Multi-path reception means that the signal which is emitted from the transmitter is not only received via the direct line of sight (LOS), but that temporally delayed signals are additionally received. The causes of this are for example reflection, refraction, scatter or diffraction of the transmitted signals. A transmitter with the same transmitting frequency, but with a different position (co-channel transmitter) can occur as a further signal source. The multi-path reception leads to the receiver, via the transmission channel, receiving a signal which consists of a superposition of the signal of the direct reception path and of the signals of temporally delayed further reception paths. The behaviour of the complete transmission channel between the transmitter and the receiver is described by the channel transmission function.

Changes of the channel transmission function lead to a phase jump in the received signal and therefore influence the estimation of the carrier frequency offset. If the channel transmission function is different for different sensor nodes, then this leads to different estimation results of the individual sensor nodes. It is for this reason that concerning OFDM receivers for communication applications, often only a differential change of the phase is considered, in order to determine the carrier frequency offset, which however leads to a reduced accuracy in the estimation of the carrier frequency offset.

One solution to this problem is to obtain knowledge of the channel and then, from this, to only use certain propagation paths for estimating the carrier frequency offset.

Mechanisms, in order to determine the channel characteristics are often integrated in OFDM signals. Thus the so-called scattered pilot signals are present in DVB-T and LTE signals and a completely known reference symbol is present in DAB. If the known transmission signal of these pilot signals is compared to the actually received values in the receiver, then the channel transmission function can be determined. A channel impulse response CIR is obtained if this function is brought into the time domain with the help of an inverse Fourier transformation. FIG. 8 shows a channel impulse response in the case of a multi-path reception. What is represented is the energy of the signal impulses which are received via different reception paths and their temporal delay with respect to the point in time of the emitting. The reception path with the shortest temporal delay corresponds to the direct reception path (line of sight, LOS). The further reception paths are also called echoes. The channel impulse response provides information on the temporal spreading of the received signals at the receiver.

Given a direct and unhindered line-of-sight connection between the OFDM transmitter and the receiver of the sensor node, the channel impulse response has a dominant impulse which represents the energy of the signal which is received via the direct reception path. The channel impulse response moreover comprises several small impulses which represent the energy of signals which are reflected e.g. by houses or mountains. The phase position of an impulse in the channel impulse response corresponds to the average phase position of the pilot tones of the received signal. The respective carrier frequency offset can be determined from each impulse of the channel impulse response by way of observing the phase position of each impulse in the channel impulse response over time. However, a constant phase rotation between the impulses of the individual echoes and the impulse of the direct reception path of the channel impulse response however exists. This phase rotation is proportional to the length of the transmission path of the echo.

In an embodiment, the previously already described determining of phase changes of the individual carriers of the signal which is received by the receiver is performed exclusively for the signal which is received via the direct reception path, in order to improve the accuracy of the estimation of the carrier frequency offset. In a further embodiment, the determining of the phase changes of the individual carriers of the signal which is received by the receiver is performed separately for each reception path. For this, the devices 72 are designed to determine the phases and/or the phase ratios of the individual carriers of one or more consecutive symbols of the control devices 70 and 70', to form the channel impulse response of the received signal and to determine the phases of the impulses of the channel impulse response.

The use of the signal which is received via the direct reception path is advantageous when the echoes are significantly smaller than the dominant impulse of the direct reception path. The energy loss due to the use of information of the echo only leads to a low worsening of the estimation of the carrier frequency offset and leads to a simplification of the algorithm.

If the direct reception path is shadowed, which means if the level of the direct reception path is no longer dominant, e.g. if the received echoes have level values which are similar to the direct reception path, it is then advantageous to use the received signals of the most powerful paths. The constant phase offset between the direct reception path and the echoes can be determined after an initial observation of the phases of the individual impulses of the channel impulse response. Thereafter, the energy of the individual paths can be combined in a phase-coherent manner, in order to obtain more precise results for the estimation of the carrier frequency offset. If the channel transmission function changes, changes of the number of impulses and their temporal position in the channel impulse response occur. In this case, it is advantageous not to include the newly arrived impulses or impulses with a changed position, in the estimation of the carrier frequency offset, until these are observed as being stable at one position in the channel impulse response for a defined time. The accuracy of the phase estimation depends on the number of pilot carriers or pilot signals which are used for the computation of the channel impulse response. Here too, it is advantageous to make a signal decision of the data carriers with regard to the pilot signals which are present and to apply the already described method of re-modulation of the received signal, in order to increase the energy for the computation of the channel impulse response.

A carrier frequency offset manifests itself in the channel impulse response in a phase change of the individual impulses. A sampling clock offset (SCO) manifests itself in a "drifting" of the impulses over time. The cause of this is the fact that the sampling clock offset leads to a temporal extension or compression of the signal with respect to the nominal signal duration. If now the channel impulse response is computed for each symbol, then a change of the peak position proportionally to the sampling clock offset results, as is shown in FIG. 9 which represents the dependency of a peak in the channel impulse response on the sampling clock offset. The x-axis of FIG. 9 represents the point in time of the channel impulse response, whereas the y-axis of FIG. 9 represents the amplitude of the channel impulse response. The curves which are shown in FIG. 9 show the channel impulse responses of the same symbol for different sampling clock offsets.

As already described beforehand, it is not absolutely necessary to completely correct the sampling clock offset for determining the carrier frequency offset. However, one must take care that inter-symbol interferences do not occur, since the channel impulse response can no longer be determined in this case. This happens if information from different OFDM symbols is used for the demodulation of the OFDM signal with the help of the FTT. The OFDM symbols are transmitted in a temporally successive manner on an individual carrier, wherein the OFDM symbols are separated from one another by way of guard intervals. For this reason, it is advantageous to place the temporal beginning of the observation region for the FTT into the middle of the guard interval. This is possible if, until then, all disturbances due to the multi-path reception have decayed. If the peak of the direct reception paths is now observed over time, this continuously changes the position in a direction on the time axis in dependence on the sampling clock offset. This change can be corrected by way of one or more additional sampling values being added into the data flow which is received by the analogue/digital converter, after each position change or after exceeding an observation threshold. The position of the impulse of the direct reception path in the channel impulse response of the next symbol is shifted again to the initial value by way of this, and the observation interval is held at a constant position. Inter-symbol interferences are avoided on account of this and the signal tracking remains stable.

Pronounced changes of the channel characteristics can briefly occur on receiving the signal of opportunity. For instance, a moving obstacle, e.g. a passer-by can lead to a high attenuation of the direct reception path when the obstacle interrupts a direct line-of-sight connection to the transmitter due to shadowing. For this reason, on determining the phase changes of the individual carriers of the signal which is received from the receiver, it is advantageous to also observe the signal energy or the signal quality such as for example the signal-to-interference ratio or the symbol/noise ratio of the impulses of the signal in the channel impulse response. As is evident from FIG. 7, a worse symbol/noise ratio leads to worse estimation results of the carrier frequency offset. If the signal-to-interference ratio or the symbol/noise ratio of an impulse in the channel impulse response falls below a predefined value or a sudden change takes place, it is advantageous to reject the estimation value of the carrier frequency offset which is based on this, in the iterative control and instead to continue to use the previously determined estimation value until the signal-to-interference ratio or the symbol/noise ratio again exceed the predefined value. By way of this, the estimation of the carrier frequency offset becomes more robust with respect to brief changes of the transmission channel which are caused for example due to shadowing.

In a further embodiment, the selection of the signals which are used for determining the phase changes of the individual carriers is performed on the basis of the signal-to-interference ratio or of the symbol/noise ratio of the impulses of the signal in the channel impulse response. If the signal-to-interference ratio (SIR) or the symbol/noise ratio of an impulse in the channel impulse response falls below a predefined value or a sudden change takes place, another impulse in the channel impulse response is used instead. Herein, one is to take care that its phase is continuous, which is to say has no large jumps, with respect to the preceding symbols. This would be down to a change of the echo path on account of a shadowing object.

The signal of opportunity can also be emitted in a so-called single-frequency network (SFN). This means that several distributed transmitter locations emit the same signal in a temporally synchronised manner at the same frequency.

FIG. 10 illustrates the effect of the emissions of two transmitters in a single frequency network (SFN) in the channel impulse response of a receiver of a sensor node. The signal of the transmitter 1 which lies geographically closer to the sensor network has a shorter direct reception path and is therefore received by the receiver at a temporally earlier stage. The signal of the transmitter 2 which is more geographically remote from the sensor network has a longer direct reception path and acts like as a high-energy multi-path reception path of the transmitter 1 with a long propagation path. The signals of the transmitters are received by the receivers in the sensor network from different directions of incidence due to the geographically different positions of the transmitter 1 and the transmitter 2. A movable obstacle would then only shadow one of the two high-energy paths. The previously described selection of the signals which are used for determining the phase changes of the individual carriers on the basis of the signal-to-interference ratio (SIR) or of the symbol/noise ratio of the impulses of the signal in the channel impulse response can therefore also be performed on reception from several transmitters of a single-frequency network. In a further development, separate oscillators with independent control-loops are used for each transmitter.

An absolute syntonisation of the local reference oscillators of the individual sensor nodes with respect to a highly accurate reference frequency is not necessary for many sensor networks, but only an as good as possible syntonisation between the local reference oscillators of the individual sensor nodes. In a geographically limited sensor network with several sensor nodes, the shadowing of the direct reception path of a transmitter acts on all sensor nodes of the sensor network to the same extent. In an embodiment, a sensor node is designed to recognise a shadowing of a first reference transmitter on the basis of a decreasing signal-to-interference ratio (SIR) or symbol/noise ratio and to subsequently continue the frequency synchronisation of the local reference oscillator with a second reference transmitter. Herein, the second reference transmitter can also be a transmitter of another frequency or of another transmission standard. The sensor node can further be designed to transmit the information concerning the currently used reference transmitter to further sensor nodes which are communicably connected to it, or to receive this information from another sensor node and to subsequently continue the frequency synchronisation of the local reference oscillator with the reference transmitter of the other sensor node. As already described, in this case, the lastly determined estimation value of the carrier frequency offset can continue to be used until determining new estimation values of the carrier frequency offset in the iterative control.

Apart from the frequency synchronisation of the sensor nodes, a time synchronisation, thus the alignment of the different local clock times of the individual sensor nodes to an external reference time such as for example the coordinated universal time (UTC) is desirable, in order for example to be able to determine a time-of-flight difference between the individual sensor nodes in the case of time-of-flight measurements. Many of the aforementioned radio signals which are suitable as a signal of opportunity comprise time stamps with a different accuracy, with which the receivers are temporally synchronised or the clock time is provided. A time synchronisation of the sensor nodes can be achieved with these time stamps.

The previously described methods can likewise be applied for WLAN signals (IEEE-802.11) as signals of opportunity. WLAN transmitters can be used in an inexpensive, compact and flexible manner. Since WLAN signals are not continuously emitted, in contrast to the emissions of DVB-T, DAB or LTE, the previously described methods are to be adapted such that absent estimation values of the carrier frequency offset do not negatively influence the frequency synchronisation. As already described, the lastly determined estimation value of the carrier frequency offset can continue to be used in an advantageous manner in the iterative control, until a new estimation value of the carrier frequency offset has been determined.

A further improvement can be achieved by way of an adaptation of the router hardware. A continuously active and as stable as possible oscillator as a reference frequency for the selected WLAN transmitter is advantageous, in order to minimise frequency deviations which for example occur for a certain period of time after switching on the oscillator. Moreover, it is advantageous, on generating the OFMD modulated signals, to use the reference frequency for the generation of the sampling clock as well as for generating the carrier frequency. The advantage is a fixed coupling of the carrier frequency offset and the sampling clock offset.

If, for example in the indoor area, the reception of the selected signal of opportunity is not possible or is restricted, suitable transmitters of a smaller power can be installed. Passive or active repeaters can alternatively be used.

The invention claimed is:

1. A method for correcting a frequency of an oscillator of a sensor node of a sensor network, the method comprising:
   receiving a transmission signal of each of a plurality of transmitters with a modulation according to orthogonal frequency-division multiplexing (OFDM);
   determining the frequency deviation of the oscillator based on the received transmission signal;
   determining a correction signal for the correction of the frequency deviation of the oscillator; and
   correcting the frequency of the oscillator with the correction signal.

2. The method according to claim 1, wherein a carrier frequency deviation of the received transmission signal is determined for determining the frequency deviation of the oscillator.

3. The method according to claim 1, wherein a sampling clock offset of the received transmission signal is determined for determining the frequency deviation of the oscillator.

4. The method according to claim 1, wherein the sampling clock offset is corrected independently of the correction of the frequency deviation of the oscillator.

5. The method according to claim 1, wherein the determining of the frequency deviation is based on a phase relation of received individual carriers of the transmission signal.

6. The method according to claim 1, wherein the determining of the sampling clock offset is based on a phase relation of received individual carriers of the transmission signal.

7. The method according to claim 1, wherein the determining of the frequency deviation is carried out for the time period of the transmission of a transmission symbol.

8. The method according to claim 1, wherein the determining of the frequency deviation is carried out for the time period of the transmission of two consecutive transmission symbols.

9. A method for correcting a frequency of an oscillator of a sensor node of a sensor network, the method comprising:
   receiving a transmission signal of a transmitter with a modulation according to orthogonal frequency-division multiplexing (OFDM);
   determining the frequency deviation of the oscillator based on the received transmission signal;
   determining a correction signal for the correction of the frequency deviation of the oscillator; and
   correcting the frequency of the oscillator with the correction signal,
   wherein:
      after receiving the transmission signal, the channel impulse response of the transmission channel is determined from the received transmission signal;
      the signals of different transmission paths of the received transmission signal are determined from the channel impulse response; and
      the frequency deviation of the oscillator is determined based on the signal of a transmission path.

10. The method according to claim 9, wherein the frequency deviation of the oscillator is determined based on the signal of a plurality of transmission paths.

11. The method according claim 9, wherein a signal for determining the frequency deviation of the oscillator is selected based on at least one of its signal energy, its signal quality, or its temporal relation to one or more other signals of the channel impulse response.

12. A method for correcting a frequency of an oscillator of a sensor node of a sensor network, the method comprising:
   receiving a transmission signal of a transmitter with a modulation according to orthogonal frequency-division multiplexing (OFDM);
   determining the frequency deviation of the oscillator based on the received transmission signal;
   determining a correction signal for the correction of the frequency deviation of the oscillator; and
   correcting the frequency of the oscillator with the correction signal,
   wherein the sensor node is communicatively connected to one or more further sensor nodes and transfers information on the receiving transmitter to one or more further sensor nodes.

13. The method according to claim 12, wherein the receiving transmitter is selected based on the information which is received from another sensor node.

14. A method for correcting a frequency of an oscillator of a sensor node of a sensor network, the method comprising:
   receiving a transmission signal of a transmitter with a modulation according to orthogonal frequency-division multiplexing (OFDM);
   determining the frequency deviation of the oscillator based on the received transmission signal;
   determining a correction signal for the correction of the frequency deviation of the oscillator; and
   correcting the frequency of the oscillator with the correction signal,
   wherein the received transmission signal comprises time information and the oscillator is time-synchronised based on the time information.

* * * * *